United States Patent [19]

Izumi et al.

[11] Patent Number: 4,680,731
[45] Date of Patent: Jul. 14, 1987

[54] REPROGRAMMABLE CARTRIDGE MEMORY WITH BUILT-IN IDENTIFICATION CIRCUITRY AND PROGRAMMING METHOD

[75] Inventors: Hideki D. Izumi; Paul J. Terrell, both of Saratoga, Calif.

[73] Assignee: Romox Incorporated, Campbell, Calif.

[21] Appl. No.: 867,886

[22] Filed: May 19, 1986

Related U.S. Application Data

[63] Continuation of Ser. No. 476,383, Mar. 17, 1983, abandoned.

[51] Int. Cl.⁴ .............................................. G06F 12/14
[52] U.S. Cl. .................................... 364/900; 365/52; 380/4
[58] Field of Search ... 364/200 MS File, 900 MS File, 364/410, 479; 360/60, 15; 369/126, 52; 235/380, 382, 382.5, 487, 488; 178/22.01–22.04, 22.08, 22.09; 365/52, 63; 380/4, 23, 25

[56] References Cited

U.S. PATENT DOCUMENTS

| | | | |
|---|---|---|---|
| 3,969,618 | 7/1976 | Strubel | 371/20 X |
| 4,156,928 | 5/1979 | Inose | 364/900 |
| 4,209,850 | 6/1980 | Taeaki et al. | 365/189 |
| 4,244,032 | 1/1981 | Oliver | 364/900 |
| 4,247,106 | 1/1981 | Jeffers | 364/410 |
| 4,281,663 | 8/1981 | Pringle | 128/689 |
| 4,325,130 | 4/1982 | Tiltscher | 364/900 |
| 4,368,519 | 1/1983 | Kennedy | 364/900 |
| 4,386,773 | 6/1983 | Bronstein | 273/1 E |
| 4,432,067 | 2/1984 | Nielsen | 364/410 |
| 4,433,207 | 2/1984 | Best | 178/22.08 |
| 4,441,164 | 4/1984 | Pavan | 364/900 |
| 4,458,315 | 7/1984 | Uchenick | 364/200 |
| 4,462,076 | 7/1984 | Smith | 364/200 |
| 4,471,163 | 9/1984 | Donald | 178/22.08 |
| 4,498,151 | 5/1985 | Henry | 364/900 |
| 4,528,643 | 7/1985 | Freeny | 360/15 |
| 4,553,252 | 11/1985 | Egendorf | 364/300 X |
| 4,593,376 | 6/1986 | Volk | 364/900 |
| 4,599,489 | 7/1986 | Cargile | 380/4 |

OTHER PUBLICATIONS

D. Allen, "The Mobile Computer, Gavilan", Oct., 1983; *Popular Computing*, p. 97.

L. A. Leventhal, "Introduction to Microprocessors: Software, Hardware, Programming", 1978, Prentice-Hall, Inc., pp. 568–569, 581–582.

"The Radio Amateur's Handbook", 1968, pp. 30, 43, 44.

"Encyclopedia of Science and Technology", McGraw Hill, 1977, pp. 660–661.

*Primary Examiner*—A. E. Williams
*Assistant Examiner*—Florin Munteanu
*Attorney, Agent, or Firm*—Flehr, Hohbach, Test, Albritton & Herbert

[57] ABSTRACT

A reprogrammable plug-in semiconductor memory cartridge for use in a personal computer system, the cartridge being reprogrammed without removing the circuitry from the cartridge. The cartridge uses a keying-locking circuitry, such as a resistor-capacitor circuit having a unique time constant which must be detected by a cartridge programming system before allowing the programming operation to start. Thus access to a programming system program library is limited only to cartridges having the above-mentioned keying-locking circuitry. A cartridge retailer maintains a master program library and a limited number of such blank cartridges rather than maintaining a large inventory of programmed cartridges.

7 Claims, 6 Drawing Figures

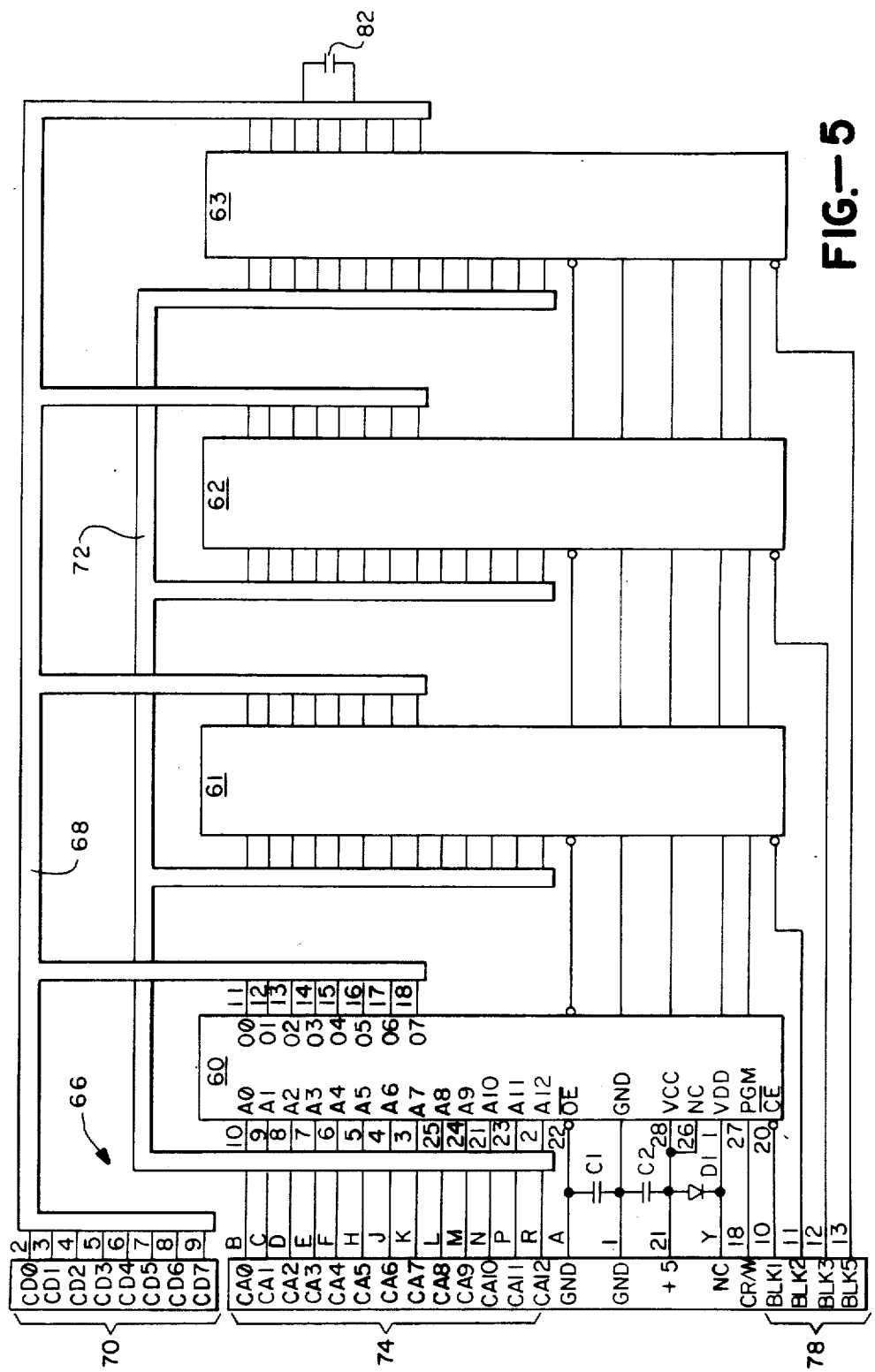
FIG.—5

REPROGRAMMABLE CARTRIDGE MEMORY WITH BUILT-IN IDENTIFICATION CIRCUITRY AND PROGRAMMING METHOD

This is a continuation of application Ser. No. 476,383 filed Mar. 17, 1983, now abandoned.

BACKGROUND OF THE INVENTION

This invention relates generally to computer memory devices, and more particularly the invention relates to a programmable cartridge memory and method of programming same.

The personal computer employs programs which are typically embodied in plug-in cartridges. A library of programs can be readily run in the computer by merely inserting a selected program cartridge into a receptacle in a computer console. For example, the Atari video cartridge system (VCS) will run a multitude of video game programs which are available in cartridge form from several suppliers.

Conventionally, programs are permanently imbedded in semiconductor chips in the cartridge. Accordingly, user must maintain a number of cartridges equal to the programs in his library. Further, the computer cartridge memory retailer must maintain a sizeable inventory of programmed cartridges to satisfy the growing needs of personal computer users.

SUMMARY OF THE INVENTION

The present invention is directed to a programmable or reprogrammable cartridge memory which can accommodate any one of a number of programs as may be desired by the computer user. Thus, rather than maintaining a physically large collection of cartridges, a user can have a limited number of cartridges which can be reprogrammed as desired. Importantly, the retailer can dispense with maintaining a large inventory of programmed cartridges. The retailer need only maintain a master copy of each available program and an inventory of blank programmable cartridge memories. Consequently, a computer user can have a desired program loaded into one of the blank cartridges, or alternatively the user can provide his own reprogrammable cartridge memory for loading of the desired program.

Accordingly, an object of the invention is a computer cartridge memory which can be reprogrammed.

Another object of the invention is a method of maintaining a program library without requiring a large inventory of memory cartridges.

A further object of the invention is a system for programming a cartridge memory without removing the semiconductor memory chip from the cartridge.

Yet another object of the invention is a memory cartridge and programming system having a keying-lock/address for limiting access to the programming system.

In accordance with one feature of the invention, a computer cartridge memory is provided with connector pins normally used in addressing and reading stored program data and instructions and also pins which accommodate the reprogramming of the cartridge memory. Thus, the semiconductor memory within the cartridge can be programmed without physically removing the semiconductor memory from the cartridge.

In accordance with another feature of the invention, the cartridge memory and programming system cooperatively define a code which enables the programming of the memory, thereby providing a security lock against unauthorized access to the program library.

The invention and objects and features thereof will be more readily apparent from the following detailed description and appended claims.

BRIEF DESCRIPTION OF THE DRAWINGS

FIG. 5 is an electrical schematic of another embodiment of a reprogrammable cartridge memory in accordance with the invention.

DETAILED DESCRIPTION OF THE INVENTION

Figure 1:
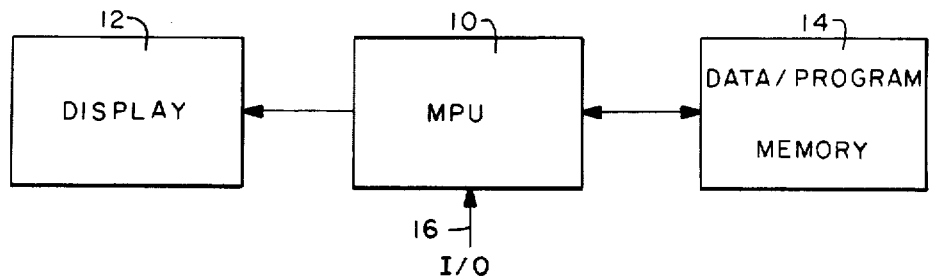
FIG. 1 is a functional block diagram of a personal computer system.

Referring now to the drawings, FIG. 1 is a functional block diagram of a personal computer or an electronic video game computer system. Basically, the system comprises a microprocessing unit (MPU) 10, a display 12, a memory 4 for data and programs, and an input-/output (I/O) port 16. Typically, the MPU 10 comprises a console which has a receptacle for receiving and interconnecting with the data/program cartridge memory 14. The MPU 10 is connected with and controls a cathode ray tube or video display 12. In a video game system the I/O port 16 is connected to external manual controls such as a joy stick.

As noted above, both the electronic video game systems and the personal computer systems will run an even increasing library of programs or video games. Heretofore, the computer system user has required a separate cartridge memory for each program in his library. Moreover, the computer system retailer has been required to maintain a large inventory of programmed cartridges of the various programs in order to satisfy the needs of the growing number of computer users.

Figure 2:
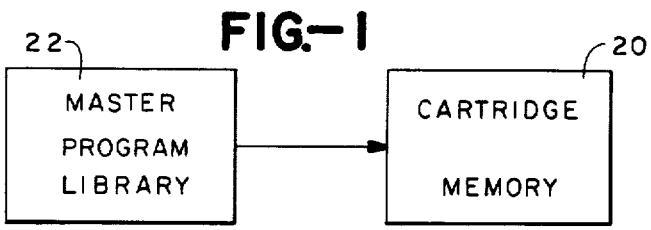
FIG. 2 is a functional block diagram illustrating the reprogramming of cartridge memories in accordance with the invention.

In accordance with the present invention a programmable or reprogrammable cartridge memory is provided whereby the computer system retailer need only maintain a master program library and a limited number of blank cartridge memories. As illustrated in FIG. 2, the retailer can connect a cartridge memory 20 with the master program library 22 for loading a desired program into a cartridge memory. Alternatively, a computer user having a reprogrammable cartridge memory can have the retailer load a desired program into the reprogrammable cartridge memory provided by the user. Importantly, the semiconductor memory need not be removed from the cartridge. Moreover, the savings in cost and space requirements to both the user and the retailer is significant with such a system.

Figure 3:
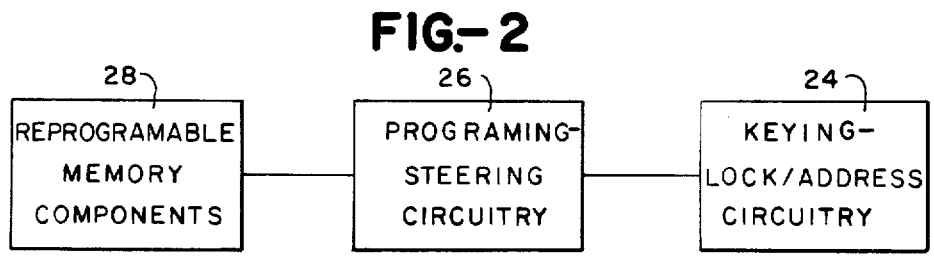
FIG. 3 is a functional block diagram of a cartridge memory in accordance with one embodiment of the invention.

FIG. 3 is a functional block diagram of a cartridge memory in accordance with one embodiment of the invention. A keying-lock/address circuitry 24 interfaces with the programming system and program library to limit access to the stored program library. The lock can comprise a tuned circuit which is identified by the programming apparatus or the lock can comprise a selected combination of address codes to which the memory responds. Once the programming system is enabled, the system enables the programming capability of the cartridge memory through the programming-steering circuitry 26. The programmable memory components 28 are then programmed or reprogrammed.

Figure 4:
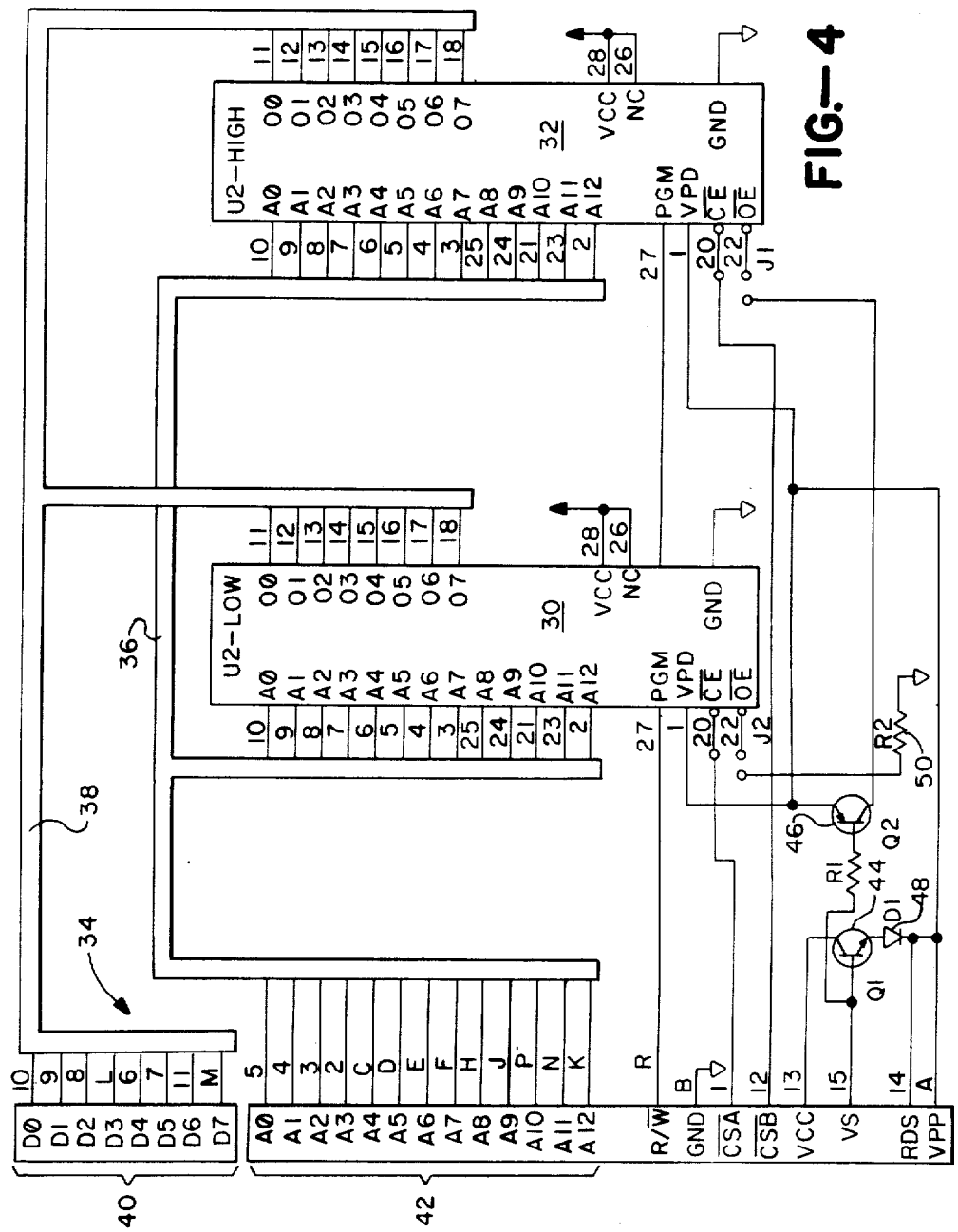
FIG. 4 is an electrical schematic of one embodiment of a reprogrammable cartridge memory in accordance with the invention.

FIG. 4 is an electrical schematic of one embodiment of a reprogrammable cartridge memory in accordance with the present invention which is designed for use in the Atari VCS. In this embodiment the memory comprises a first memory bank 30 and a second memory bank 32. Each memory bank comprises a reprogrammable semiconductor memory such as the 2764 erasable programmable read only memory (Eprom) semiconductor chip having 8K bytes (3 bits per byte) of storage capacity. The two memories are interconnected with a printed circuit board edge connector shown generally at 34 through an address bus 36 and a data output bus 38. The 8 bit data bus 38 is interconnected with terminals 40 of the connector 34, and the 13 address bits A0-A12 are connected through the address bus 38 with the terminals 42 of connector 34. The connector 34 also includes an operation mode terminal (R/$\overline{W}$) which is connected to a program (PGM) terminal of each of the memories 30 and 32. Each memory also has a terminal for receiving the program voltage (VPP) which is connected to the terminal VPP of the connector 34. The connector 34 mates with a connector in the receptacle of the computer console or a system connector for the loading of a program in the cartridge memory.

In this embodiment during normal operation the operating voltage VCC is applied to the program terminal VPP of the memories through a transistor switch comprising transistors 44 and 46. During normal operation the NPN transistor 44 is rendered conductive thereby applying the voltage VCC through diode 48 to the VPP terminals of the memories 30, 32. During the programming mode, NPN transistor 44 is rendered non-conductive and PNP transistor 46 becomes conductive thereby connecting the terminals VPP through resistor 50 to ground. Thus, during the programming mode the voltage VPP is applied to the VPP terminals of the memory 30, 32 and is connected through the resistor 50 to ground.

FIG. 5 is an alternative embodiment of a reprogrammable memory in accordance with the invention in which four banks of memory 60, 61, 62, and 63 are provided. Again, each memory comprises a programmable semiconductor chip such as the 8K byte 2764 Eeprom chip. The memories 60–63 are again interconnected with an edge connector shown generally at 66. The data output lines are interconnected through the data bus 68 with terminals 70 of connector 66, and the address lines of the memory 60–63 are interconnected through an address bus 72 with the terminals 74 of the connector 66. The blocks of memory are selected by means of terminals 78 which are interconnected to the chip enable, $\overline{CE}$, of the memory banks 60–63. In this embodiment the programming voltage VPP is connected directly to the VPP terminals of the memory 60–63, and the mode control terminal 80 is connected to the PGM terminal of each of the memory banks 60–63.

In this embodiment a capacitor 82 is connected across two data lines, or alternatively two address lines. Capacitor 82 and the memory comprise an RC circuit having a time constant which is identified by the programming system before enabling the programming of the memory. Accordingly, an unauthorized cartridge memory can be prevented from accessing the program library.

Figure 6:
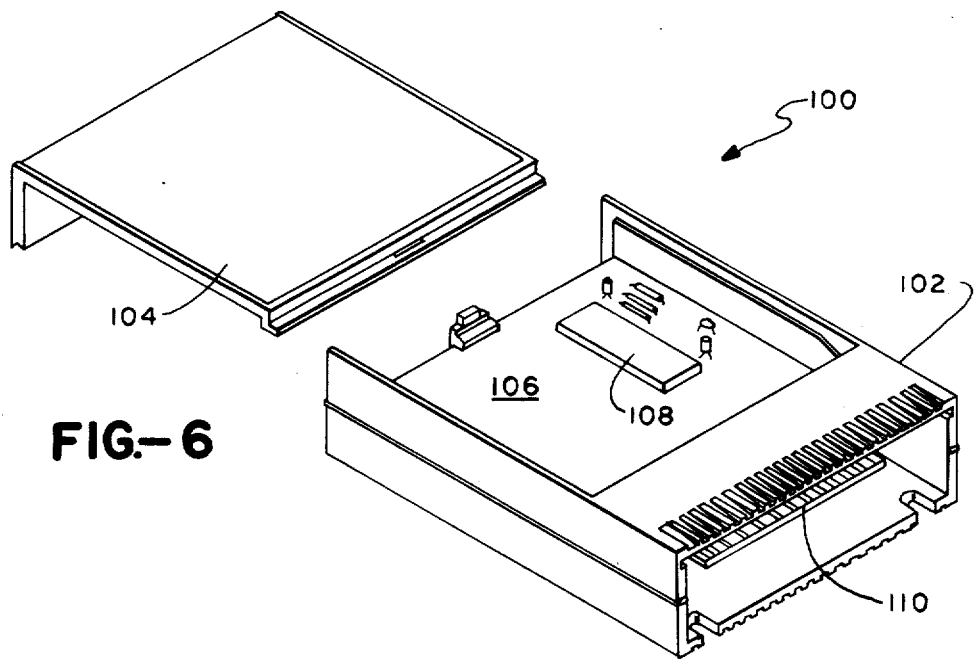
FIG. 6 is a perspective view of a computer memory cartridge in accordance with one embodiment of the invention.

The reprogrammable memories in accordance with the present invention can be embodied in a conventional cartridge housing such as the cartridges disclosed in copending application Ser. No. A-38703. FIG. 6 is a perspective view of one cartridge disclosed in the application. The cartridge shown generally at 100 includes a housing portion 102 and a cover 104 which mates therewith. Mounted within the housing 102 is a printed circuit board 106 in which the electronic circuitry including memory 108 is mounted. The memory 108 and circuitry is interconnected with a computer console through connectors on an edge 110 of the printed circuit board which extends into an opening at the front of the housing 102.

A reprogrammable cartridge in accordance with the invention enables flexibility and economy in use both by the retailer and the computer system user. While the cartridge has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A plug-in memory cartridge for use in a computer system using programs stored in plug-in memory cartridges, said plug-in memory cartridge comprising:
a cartridge housing,
programmable semiconductor memory circuitry supported within said housing,
connector means for interconnecting said programmable memory circuitry to said computer system or to a cartridge programming system, said connector means including an address bus terminal means for providing addresses to said programmable semiconductor memory circuitry, an operation mode terminal means for providing read and write mode signals to said programmable semiconductor memory circuitry, and program voltage terminal means for providing a programming voltage to said programmable semiconductor memory circuitry when the cartridge is connected to said cartridge programming system and is in a write mode, and keying-locking circuitry within said cartridge housing, connected to said connector means and uniquely identifying said cartridge, said keying-locking circuitry being tested by said cartridge programming system prior to selectively enabling a programming operation of said programmable semiconductor memory circuitry, whereby only cartridges having said keyinglocking circuitry are programmed by said cartridge programming system.

2. The plug-in memory cartridge as defined by claim 1 wherein said connector means includes operating voltage terminal means for applying an operating voltage to said programmable semiconductor memory circuitry during read and write operations.

3. The plug-in memory cartridge as defined by claim 1 wherein said programmable semiconductor memory circuitry comprises a plurality of semiconductor chips, each of said chips having an enable terminal, and said connector means including memory select terminal means connected to each enable terminal for selectively enabling one of said semiconductor memory chips.

4. The plug-in memory cartridge as defined by claim 1 wherein said programmable semiconductor circuitry is reprogrammable.

5. The plug-in memory cartridge as defined by claim 4 wherein said programmable semiconductor circuitry comprises an Eeprom.

6. The plug-in memory cartridges as defined by claim 1 wherein said keying-locking circuitry comprises an RC circuit whose time constant defines an enabling code recognizable by said cartridge programming system.

7. In a computer system using a plug-in cartridge memory storing a program, the computer system having a computer console, a first connector receptacle, and a plug-in cartridge mating with said first connector receptacle, a method of providing from a cartridge programming system, having a second connector receptacle mating with said plug-in cartridge, one of a plurality of programs for use in said computer system, the method comprising the steps of:

providing in said cartridge programming system a master program library including a plurality of programs, providing a programmable cartridge memory having a connector for reception by said first connector receptacle, providing said programmable cartridge memory with keying-locking circuitry which identifies said cartridge as a cartridge authorized to receive a program from said program library, inserting said connector into said second connector receptacle of said cartridge programming system, enabling the loading of one of said plurality of programs only if said cartridge programming system detects the presence of said keyinglocking circuitry and said cartridge is authorized to receive a program, and loading said one of said plurality of programs in said programmable cartridge memory.

* * * * *